(12) United States Patent
Lee et al.

(10) Patent No.: US 8,906,707 B2
(45) Date of Patent: Dec. 9, 2014

(54) DEVICE HAVING A MULTILAYERED STRUCTURE AND METHOD OF FABRICATING THEREOF

(75) Inventors: Young Joo Lee, Seoul (KR); Hyunjung Kim, Gyeonggi-do (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 191 days.

(21) Appl. No.: 12/677,088

(22) PCT Filed: Feb. 20, 2008

(86) PCT No.: PCT/KR2008/000984
§ 371 (c)(1),
(2), (4) Date: Apr. 30, 2010

(87) PCT Pub. No.: WO2009/031736
PCT Pub. Date: Mar. 12, 2009

(65) Prior Publication Data
US 2011/0012163 A1 Jan. 20, 2011

(30) Foreign Application Priority Data
Sep. 7, 2007 (KR) .......................... 10-2007-0091223

(51) Int. Cl.
H01L 21/66 (2006.01)
H01L 21/00 (2006.01)
H01L 51/52 (2006.01)
H01L 51/50 (2006.01)

(52) U.S. Cl.
CPC ............ H01L 51/5221 (2013.01); H01L 22/12 (2013.01); H01L 51/5092 (2013.01)
USPC ........... 438/14; 438/22; 438/99; 257/E21.158

(58) Field of Classification Search
CPC .. H01L 51/5221; H01L 51/5092; H01L 22/12
USPC ............ 438/29, 99, 82, 14, 22; 257/E51.017, 257/E21.158
See application file for complete search history.

(56) References Cited

U.S. PATENT DOCUMENTS

| | | | |
|---|---|---|---|
| 4,842,933 A * | 6/1989 | Cizmecioglu | 428/378 |
| 5,581,117 A * | 12/1996 | Kawano | 257/627 |
| 5,739,545 A | 4/1998 | Guha et al. | |
| 6,316,786 B1 | 11/2001 | Mueller et al. | |
| 6,851,996 B2 | 2/2005 | Blaessing et al. | |
| 7,030,866 B2 | 4/2006 | Chen | |
| 2004/0072027 A1* | 4/2004 | Lu et al. | 428/694 R |

OTHER PUBLICATIONS

Lee, Young Joo et al., "Diffusion of LiF into Al Cathode in Alq3 Based OLED", Bulletin of the Korean Physical Society, 25-2, Apr. 2007.

* cited by examiner

Primary Examiner — Michael Trinh

(57) ABSTRACT

The invention provides a multilayered device and the method for fabricating the same. The multilayered device comprises a substrate, a first layer deposited on the substrate, a second layer deposited on the first layer, and a third layer deposited on the second layer. The coverage of the second layer is determined by a rate of crystallization of the third layer. The rate of crystallization of the third layer is determined by measuring X-ray diffraction of the device.

17 Claims, 7 Drawing Sheets

US 8,906,707 B2

DEVICE HAVING A MULTILAYERED STRUCTURE AND METHOD OF FABRICATING THEREOF

CLAIM FOR PRIORITY

The present application claims priority under 35 U.S.C. §371 to PCT Application PCT/KR2008/000984, filed on Feb. 20, 2008, which claims priority to Korean Patent Application No. 10-2007-0091223, filed on Sep. 7, 2007, the disclosures of which are hereby incorporated by reference in their entireties.

FIELD OF THE INVENTION

This invention relates to a device having a multilayered structure and a method for fabricating the same. More particularly, this invention relates to a multilayered device comprising at least a first layer, a second layer, and a third layer, which is fabricated by evaluating the coverage of the second layer by means of the rate of crystallization of the third layer, and the method for fabricating the multilayered device.

BACKGROUND OF THE INVENTION

Devices having a multilayered structure have been widely used as electronic devices. Each layer of the multilayered device may be a functional layer for performing a special function for the device. For example, referring to FIG. 1, an organic light emitting device (OLED) 10 is fabricated by forming a hole injection layer (not shown), a hole transport layer (not shown), an emitting layer 120, an electron transport layer 120, and an electron injection layer 130 between an anode 110 and a cathode 140. Each functional layer may be consisted of an organic and/or inorganic material(s) suitable for performing respective special function. OLED can be significantly improved in terms of I-V characteristics, luminescence efficiency, and operating lifetime by inserting such functional layers between the anode and the emitting layer, and between the emitting layer and the cathode.

In a case of a small molecule type OLED, indium tin oxide may be generally employed for the anode, and copper phthalocyanine (CuPC) may be generally employed for the hole injection layer, and N,N'-Bis(naphthalen-1-yl)-N,N'-bis(phenyl)benzidine (NPB) may generally be employed for the hole transport layer, and tris-(8-hydroxyquinoline)aluminum ($Alq_3$) may be generally employed for the emitting layer. $Alq_3$ may also be employed for the electron transport layer. Other materials may be employed for each of the functional layers. As the electron injection layer, any one selected from the group comprising LiF, CsF, NaF, NaCl, etc., may be employed. As the cathode, any one selected from the group comprising Al, Ca, Mg, Ag, etc., and their compounds may be employed. In order to improve the luminescence efficiency and the operating lifetime, the thickness of the electron injection layer, for example LiF, may be selected from the optimal range near approximately 10 Å. When the nominal thickness of LiF is about 10 Å, the coverage of LiF on the $Alq_3$ was evaluated to be approximately 66% as will be discussed later.

According to a conventional technique, the coverage of LiF on $Alq_3$ has been estimated by means of atomic force microscopy (AFM), which involves calculating the ratio of the covered area with LiF on $Alq_3$ to the total surface area of $Alq_3$. According to another conventional technique, the coverage of LiF on $Alq_3$ has been estimated by means of X-ray Photoemission Spectroscopy (XPS), which involves analyzing and identifying the chemical elements along the depth profile of the OLED. However, such conventional techniques are complicated in views of measurement and analysis, and require a long time to get the coverage. Further, the conventional techniques involve destructing the sample during the measurement process.

SUMMARY OF THE INVENTION

It is therefore an object of the present invention to address those problems.

Another object of the present invention is to provide a multilayered OLED, in which the coverage of LiF on $Alq_3$ is simply determined in a time-cost efficient manner, and a method for fabricating the same.

Other object of the present invention is to provide any multilayered device as well as an OLED comprising more than or equal to three layers, in which the coverage of a second layer on a first layer is simply determined in a time-cost efficient manner, and a method for fabricating the same.

The objects of the present invention can be achieved by measuring the rate of crystallization of the third layer (for example, Al (a cathode)) to determine the coverage of the second layer (for example, LiF (an electron injection layer)) on the first layer (for example, $Alq_3$ (an electron transport layer or an emitting layer).

DETAILED DESCRIPTION OF THE INVENTION

The device performance of OLEDs is improved significantly by interposing LiF between Al cathode and $Alq_3$ (an electron transport layer or an emitting layer). LiF lowers the potential barrier height at the interface between Al and $Alq_3$, and thereby enhances the injection of the minority charge carriers (electrons) and improves charge balance between holes and electrons, and thus improves the luminescence efficiency. Further, Al cathode becomes better stable against atmospheric corrosion.

However, it has been reported that in general, if the nominal thickness of LiF is larger than or equal to about 15 Å, I-V characteristics and the luminescence efficiency of OLED are rather deteriorated. Maybe it is because that if the nominal thickness of LiF is larger than about 15 Å, the coverage of LiF is excessively increased to start to form a substantial layer, so that $Alq_3$, LiF and Al are not likely to coexist to react together and fail to form a reliable contact of the cathode to the layer(s) underneath.

FIGS. 2A to E are AFM pictures showing distributions of LiF on $Alq_3$ as a function of the nominal thickness of LiF, for example 5 Å, 10 Å, 15 Å, 20 Å, and 25 Å.

Figure 1:
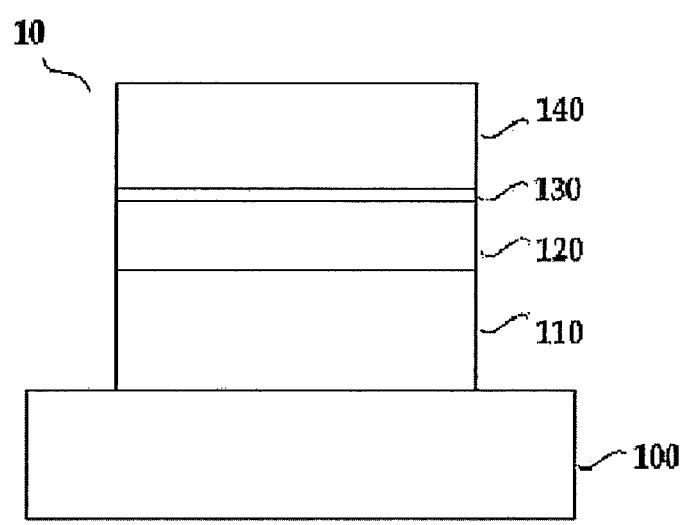
FIG. 1 shows a cross sectional view of the multilayered device (for example, OLED) to which the present invention may be applied.
Figure 2A:
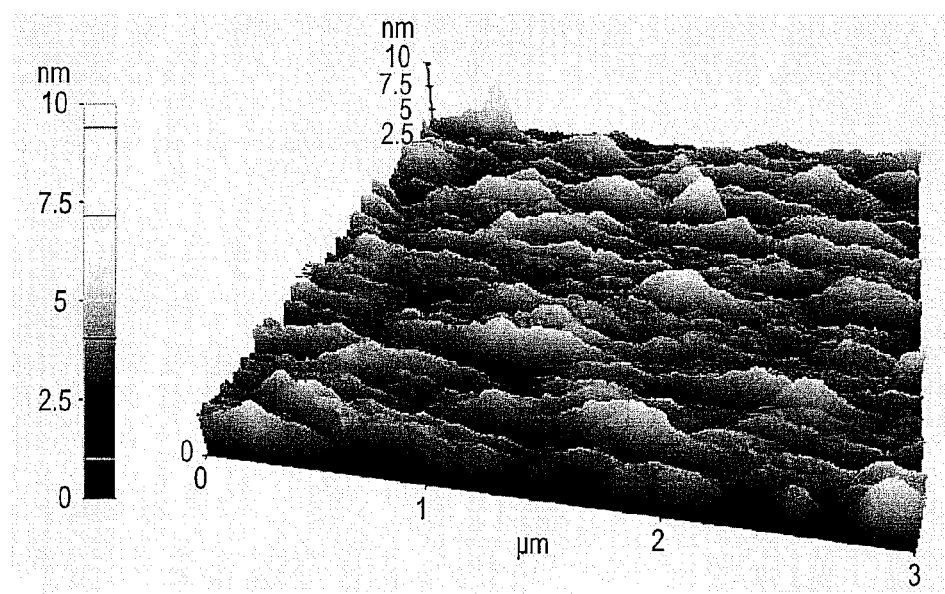
FIGS. 2A to E are AFM pictures showing distributions of LiF on $Alq_3$ as a function of the nominal thickness of LiF, for example 5 Å, 10 Å, 15 Å, 20 Å, and 25 Å.
Figure 2B:
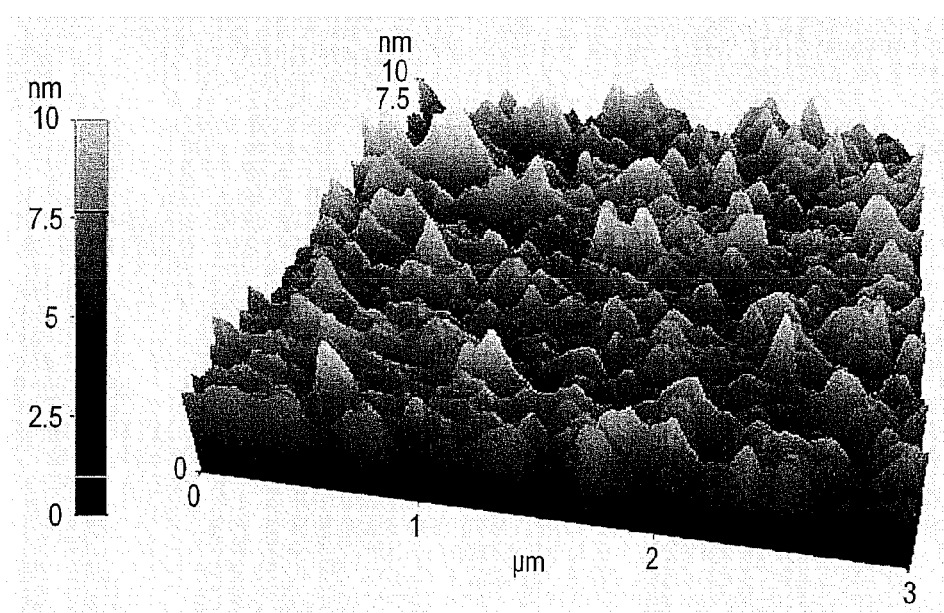
Figure 2C:
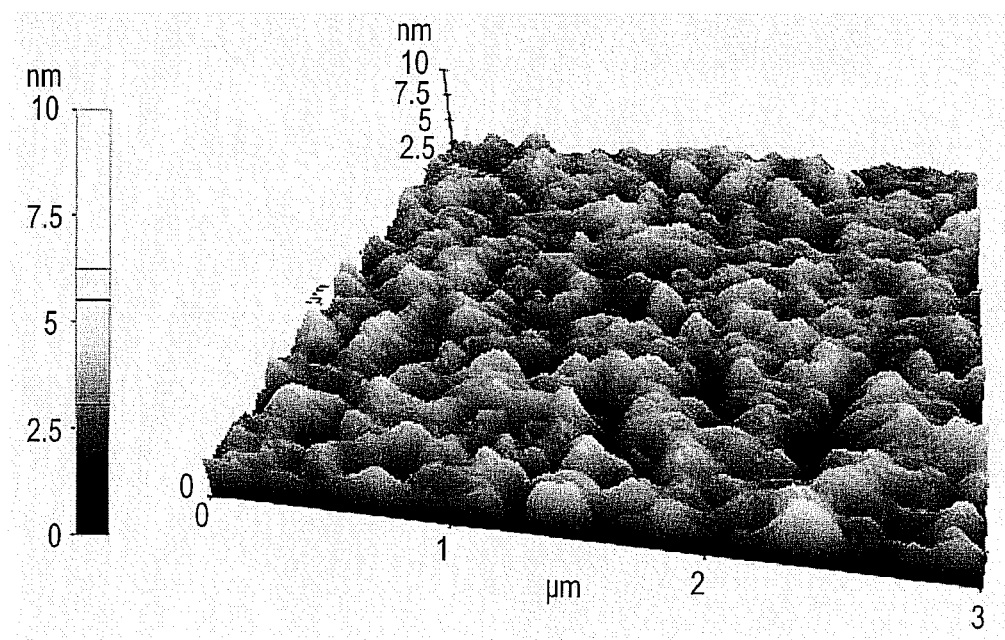
Figure 2D:
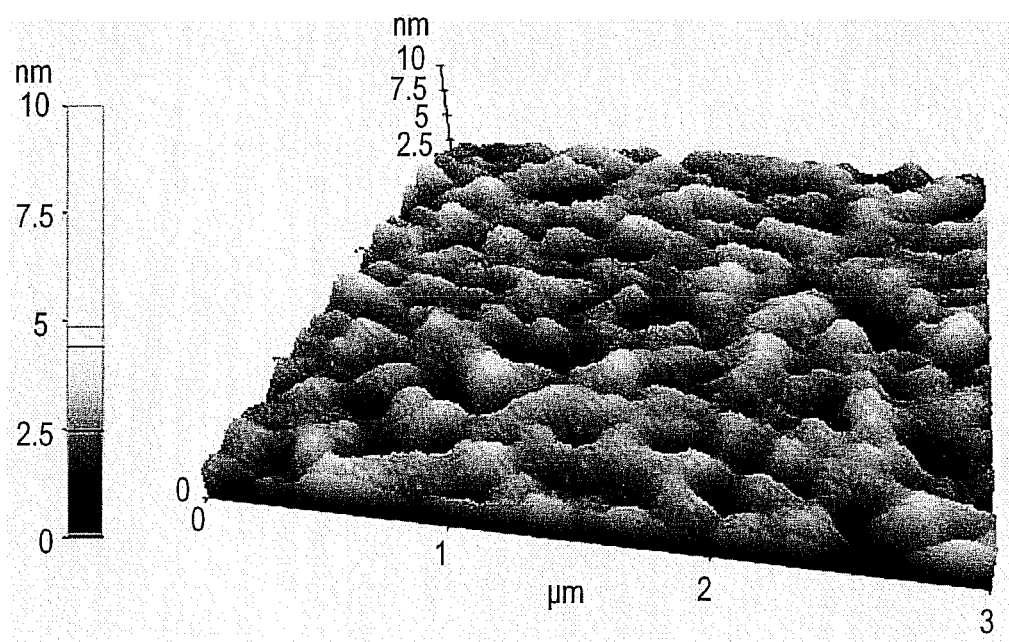
Figure 2E:
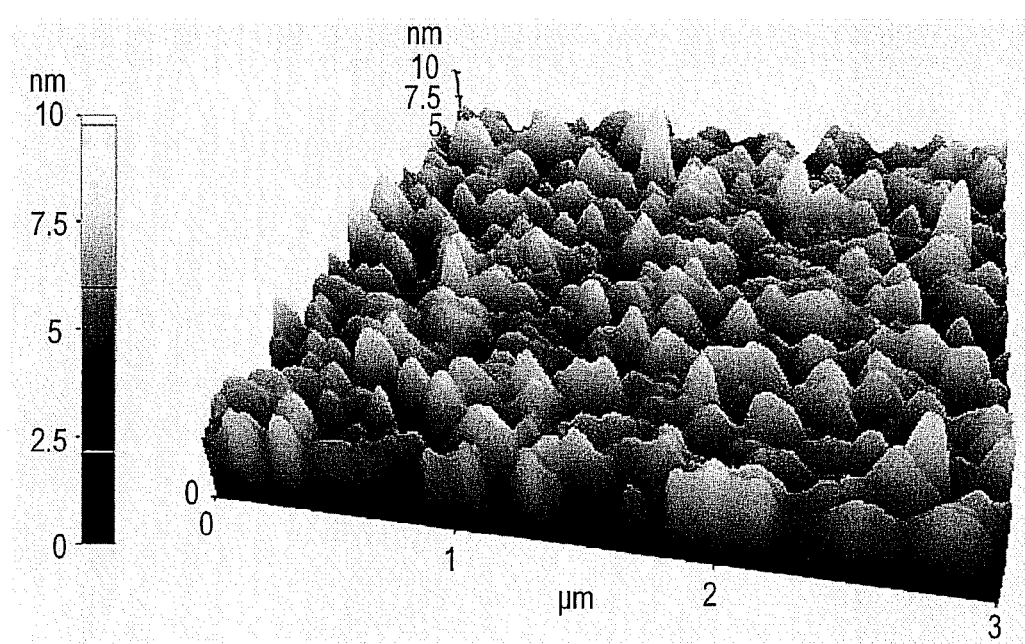

Referring to FIGS. 2A to E, it can be understood that the coverage of LiF on $Alq_3$ increases with the increase in the nominal thickness of LiF to, for examples, 5 Å (FIG. 2A), 10 Å (FIG. 2B), 15 Å (FIG. 2C), 20 Å (FIG. 2D), and 25 Å (FIG. 2E).

However, the coverage of LiF on Alq$_3$ does not increase directly proportional to the nominal thickness of LiF. Referring to FIG. 2A, LiF molecules conglomerate and distribute sporadically on the Alq$_3$ layer having its own roughness, and thus fail to form a substantial layer. Referring to FIG. 2B (where the nominal thickness of LiF is 10 Å), LiF molecules are accumulated to the conglomerated LiF clusters, so that although LiF molecules do not yet form a substantial layer, the distributed deposit area and the density of LiF increase more than those in the case of FIG. 2A where the nominal thickness of LiF is 5 Å.

Referring to FIGS. 2C to E (where the nominal thickness of LiF is 15 Å, 20 Å and 25 Å, respectively), the coverage of LiF increases more and more so that it may reach almost 100% as the nominal thickness of LiF increases to 25 Å.

Figure 3:
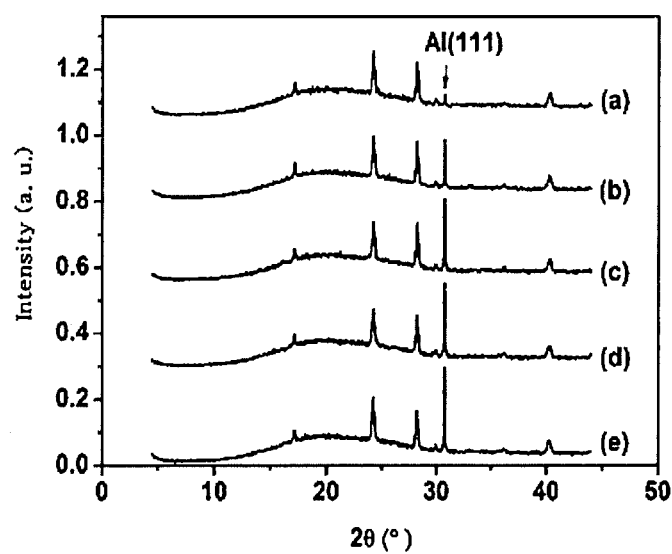
FIG. 3 is a graph showing a relation between the intensity of Al (111) peak and the nominal thickness of LiF, for example 5 Å, 10 Å, 15 Å, 20 Å, and 25 Å.

FIG. 3 shows the intensity pattern obtained by X-ray diffraction from Al/LiF/Alq$_3$/ITO-Glass as a function of the nominal thickness of LiF. As shown in FIG. 3, with an increase in the nominal thickness of LiF, the intensity of the crystallization peak of Al (111) increases gradually (when LiF thickness increases to (a) 5 Å and (b) 10 Å) and then increases dramatically (when LiF thickness increases to (c) 15 Å, (d) 20 Å, and (e) 25 Å). It means that when the nominal thickness of LiF increases from 5 Å to 25 Å, the coverage of LiF initially increases slowly and then abruptly later, and thus the intensity of the Al (111) diffraction peak increases in the same pattern. It may be due to that the lattice constant of LiF is close to that of Al, and thus LiF induces ordering of Al to (111). When Al is grown, the ordering or crystallization of Al is not induced or enhanced on the surface regions of Alq$_3$ where Alq$_3$ is not covered with LiF. Further, even when LiF itself does not show any clear crystalline characteristics, it was observed that LiF induces ordering of Al to (111).

According to the present invention, in the embodiment of OLEDs (Al/LiF(5 Å)/Alq$_3$/ITO-Glass, Al/LiF(10 Å)/Alq$_3$/ITO-Glass, Al/LiF(15 Å)/Alq$_3$/ITO-Glass, Al/LiF(20 Å)/Alq$_3$/ITO-Glass, and Al/LiF(25 Å)/Alq$_3$/ITO-Glass), the coverage of LiF on Alq$_3$ was evaluated, for example, to (a) about 25%, (b) about 66%, (c) about 95%, (d) about 99%, and (e) about 100%, respectively, when the nominal thickness of LiF was, for example, (a) 5 Å, (b) 10 Å, (c) 15 Å, (d) 20 Å, and (e) 25 Å when making use of the intensity of the crystallization peak of Al (111) from the respective OLEDs. The intensity of the crystallization peak of Al (111) may be measured by X-ray diffraction technique.

Therefore, by depositing LiF on Alq$_3$ with a specific thickness corresponding to a desired coverage of LiF on Alq$_3$, which may be toughed by the level of the ordering or crystallization of Al to (111), OLED may be fabricated simply and cost effectively in order to have the optimal I-V characteristics, the optimal luminescence efficiency, and the improved operating lifetime in relation to the electron injection layer, LiF. The level of ordering or crystallization of Al to (111) may be determined in a nondestructive and time cost efficient manner by X-ray diffraction technique.

According to one embodiment of the present invention, Alq$_3$ is deposited on the ITO-coated glass with a predetermined nominal thickness (about 500 Å), and then LiF is deposited on Alq$_3$ with various thicknesses, and then Al is deposited with a predetermined nominal thickness (about 800 Å) by controlling the deposition rate and time to fabricate Al/LiF(5 Å)/Alq$_3$/ITO-Glass, Al/LiF(10 Å)/Alq$_3$/ITO-Glass, Al/LiF(15 Å)/Alq$_3$/ITO-Glass, Al/LiF(20 Å)/Alq$_3$/ITO-Glass, and Al/LiF(25 Å)/Alq$_3$/ITO-Glass. The deposition process may be performed by use of vapor deposition, vacuum thermal evaporation deposition, chemical vapor deposition, and/or sputtering and so on according to the requirement for the preferable device. It is noted that one may fabricate OLEDs with more various thicknesses of LiF including the thicker LiF of, for example, 50 Å.

Then, the intensity of Al (111) crystallization peak may be measured from each of the OLEDs by X-ray diffraction technique. A table for storing the corresponding relation between the nominal thickness of LiF and the intensity of Al (111) crystallization peak may be prepared and recorded in a computer readable storage medium.

The coverage of LiF on Alq$_3$ may be evaluated by normalizing the intensity of Al (111) crystallization peak of the OLEDs having thinner LiF (for example, Al/LiF(5 Å)/Alq$_3$/ITO-Glass, Al/LiF(10 Å)/Alq$_3$/ITO-Glass, Al/LiF(15 Å)/Alq$_3$/ITO-Glass, and Al/LiF(20 Å)/Alq$_3$/ITO-Glass) to the intensity of Al (111) peak of the OLED having the sufficiently thicker LiF whose coverage on Alq$_3$ reaches 100% or almost 100% (for example, Al/LiF(25 Å)/Alq$_3$/ITO-Glass or Al/LiF(50 Å)/Alq$_3$/ITO-Glass). Such evaluated coverages of LiF on Alq$_3$ may be stored in the table with the corresponding nominal thicknesses of LiF and/or the intensities of the Al (111) crystallization peaks.

After then, the coverage of LiF on Alq$_3$ of OLED (for example, Al/LiF/Alq$_3$/ITO-Glass) with an arbitrary thickness of LiF may simply be determined by measuring X-ray powder diffraction pattern to obtain the intensity of the Al (111) crystallization peak, and then searching for the coverage of LiF corresponding to the (normalized) intensity of the Al (111) peak from the table. The use of the proper normalization of the intensity of Al (111) peak to its saturated maximum may make this technique less vulnerable to the various device conditions. In general, LiF is employed with an ultra-thin thickness for OLED applications. As discussed above, referring to FIGS. 2A to E, LiF is prone to conglomerate in the initial growth stage, so that its surface is very rough and there is somewhat large difference between its real thickness and the nominal thickness. As such, even when the thickness of the LiF layer is not known exactly as well as when the LiF layer has arbitrary thickness, the coverage of LiF on Alq$_3$ can simply be determined based on the principles of the present invention.

When LiF is deposited on Alq$_3$ with sufficiently large thickness to reach its coverage of almost 100%, the intensity of the diffraction peak of Al (111), representing the level of ordering or crystallization of Al to (111), may become saturated. After the saturation, even though the thickness of LiF further increases, the diffraction peak of Al (111) does not further increase.

In a case that the thickness of the Al layer is larger than 800 Å (for example, 1000 Å, or 1500 Å and so on), the intensity and saturated intensity of the diffraction peak of Al (111) relative to the thickness of the LiF may become higher than those in the case that the thickness of the Al layer is 800 Å. It is because that if Al is thicker, then the amount of Al molecules to be crystallized increases. On the other hand, in a case that the thickness of Al is smaller than 800 Å (for example, 500 Å and so on), the intensity and the saturated intensity of the diffraction peak of Al (111) relative to the thickness of the LiF may become lower than those in the case that the thickness of the Al layer is 800 Å. It is because that if Al is thinner, then the amount of Al molecules to be crystallized decreases.

Accordingly, if the thickness of Al is changed for a new desired OLED, the table for storing the corresponding relation between the nominal thickness of LiF and the intensity of the crystallization (or diffraction) peak of Al (111), together with the coverage of LiF on Alq$_3$ may be newly prepared in a similar manner as discussed above, in order to reflect the changed (saturation) peak intensity of Al (111) to normalization of the intensities of the Al (111) peaks from the newly sampled OLEDs with various LiF thicknesses. Thus, the coverage of LiF on $Alq_3$ may be simply determined for the new OLEDs having the changed thickness of the Al cathode by measuring the level of crystallization (or the crystallization rate) of Al to (111) and referring to the new table.

Similarly, the intensity of the crystallization (or diffraction) peak of Al (111) may be normalized to the peak intensity of Al (111) saturated when the coverage of LiF reaches almost 100%.

According to one embodiment, the intensity of the crystallization (or diffraction) peak of Al (111) may be normalized to any obvious diffraction peak intensity of other material, for example, ITO.

According to one embodiment, after measuring the X-ray diffraction peak of Al (111) multiple times from the device (for example, Al/LiF/$Alq_3$/ITO-Glass) at different locations and then normalizing the intensities of the peak, the normalized intensities of the Al (111) peak may be averaged.

Another embodiment of the present invention may provide a multilayered device comprising at least a first layer, a second layer, and a third layer, in which the first layer has features for inducing crystallization of the third layer while the second layer has no feature for inducing crystallization of the third layer. In this embodiment, the intensity of the crystallization peak of the third layer rather decreases with an increase in the coverage of the second layer on the first layer, inversely to the aforementioned embodiment of OLEDs. However, the principle of the present invention may be applicable to this embodiment similarly, so that the coverage of the second layer on the first layer can be determined based on the rate of crystallization of the third layer. The only difference between OLED embodiment and this embodiment is whether the relation between the rate of crystallization of the third layer and the coverage of the second layer is proportional or reversely proportional. This may be easily understood by a person having ordinary skill in the art.

Although the present invention has been described mostly with reference to OLEDs, the present invention should not be conceived to be limited to OLED applications. The principles and concepts of the present invention may be applicable to any multilayered systems comprising at least three layers including a first layer, a second layer and a third layer, in which one of the first layer and the second layer has a feature to induce the crystallization of the third layer while the other of the first layer and the second layer has no feature to induce the crystallization of the third layer. Thus, the coverage of the second layer on the first layer is associated with the rate of crystallization of the third layer.

Further, if the third layer has an intrinsic ordering to the same lattice direction with the induced ordering, the intrinsic crystallization rate may be subtracted when evaluating the crystallization rate of the third layer induced (enhanced or reduced) by the first or second layer. Accordingly, the coverage of the second layer on the first layer affecting the induced rate of crystallization of the third layer may be exactly evaluated.

Any embodiment(s) referred to herein may not necessarily be the same embodiment, but may be an arbitrary embodiment(s) to which the present invention may be applicable.

According to the present invention, OLED comprising at least Al/LiF/$Alq_3$/ITO-Glass, in which the coverage of LiF on $Alq_3$ is determined in a simple and time cost efficient manner by means of the rate of crystallization of Al, and the method for fabricating the same are provided.

Further, according to the present invention, a multilayered device comprising at least three layers, in which the coverage of the second layer on the first layer is determined simply by the rate of crystallization of the third layer, and the method for fabricating the same are provided.

The invention claimed is:

1. A method for fabricating a multilayered device comprising steps of:
    depositing a first layer on a substrate;
    depositing a second layer on the first layer; and
    depositing a third layer on the second layer,
    wherein depositing the second layer comprises depositing the second layer on the first layer with a thickness determined based on a crystallization rate of the third layer induced by the second layer, the crystallization rate having been detected by an intensity of X-ray powder diffraction peak, the thickness providing a predetermined coverage of the second layer on the first layer.

2. A method of claim 1, wherein the crystallization rate of the third layer increases as increasing the coverage of the second layer on the first layer.

3. A method of claim 1, wherein the coverage of 100% of the second layer on the first layer corresponds to a saturation of the crystallization rate of the third layer.

4. A method of claim 1, wherein the crystallization rate of the third layer decreases as increasing the coverage of the second layer on the first layer.

5. A method of claim 1, wherein the substrate is comprised of an ITO coated glass; the first layer is comprised of an Alq3layer; the second layer is comprised of an LiF layer; and the third layer is comprised of an Al layer.

6. A method of claim 2, wherein the substrate is comprised of an ITO coated glass; the first layer is comprised of an Alq3layer; the second layer is comprised of an LiF layer; and the third layer is comprised of an Al layer.

7. A method of claim 3, wherein the substrate is comprised of an ITO coated glass; the first layer is comprised of an Alq3layer; the second layer is comprised of an LiF layer; and the third layer is comprised of an Al layer.

8. A method for detecting a coverage of a constituent layer of a multilayered device, wherein the device comprises:
    a substrate,
    a first layer deposited on the substrate,
    a second layer deposited on the first layer, and
    a third layer deposited on the second layer,
    the method comprising:
    detecting a coverage of the second layer on the first layer based on a crystallization rate of the third layer induced by the second layer, the crystallization rate being determined by an intensity of X-ray powder diffraction peak.

9. A method of claim 8, wherein the crystallization rate of the third layer increases as increasing the coverage of the second layer on the first layer.

10. A method of claim 8, wherein the coverage of 100% of the second layer on the first layer corresponds to a saturation of the crystallization rate of the third layer.

11. A method of claim 8, wherein the crystallization rate of the third layer decreases as increasing the coverage of the second layer on the first layer.

12. A method of claim 8, wherein the substrate is comprised of an ITO coated glass; the first layer is comprised of an Alq3layer; the second layer is comprised of an LiF layer; and the third layer is comprised of an Al layer.

13. A method for fabricating a multilayered device, the method comprising:
    depositing a first layer on a substrate,
    depositing a second layer on the first layer, and depositing a third layer on the second layer, wherein depositing the second layer comprises depositing the second layer on the first layer with a thickness, the thickness providing a predetermined coverage of the second layer on the first layer, the coverage being detected by the method as set forth in claim 8.

14. A method of claim 13, wherein the crystallization rate of the third layer increases as increasing the coverage of the second layer on the first layer.

15. A method of claim 13, wherein the coverage of 100% of the second layer on the first layer corresponds to a saturation of the crystallization rate of the third layer.

16. A method of claim 13, wherein the crystallization rate of the third layer decreases as increasing the coverage of the second layer on the first layer.

17. A method of claim 13, wherein the substrate is comprised of an ITO coated glass; the first layer is comprised of an Alq3 layer; the second layer is comprised of an LiF layer; and the third layer is comprised of an Al layer.

* * * * *